United States Patent
Shin et al.

(10) Patent No.: US 11,239,794 B2
(45) Date of Patent: Feb. 1, 2022

(54) COUPLED FREQUENCY DOUBLER WITH FREQUENCY TRACKING LOOP

(71) Applicant: Intel Corporation, Santa Clara, CA (US)

(72) Inventors: Dongseok Shin, Portland, OR (US); Hyung Seok Kim, Portland, OR (US); Yongping Fan, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/898,254

(22) Filed: Jun. 10, 2020

(65) Prior Publication Data

US 2021/0391826 A1    Dec. 16, 2021

(51) Int. Cl.
*H03B 5/12* (2006.01)
*H03L 7/24* (2006.01)
*H03B 19/00* (2006.01)

(52) U.S. Cl.
CPC ......... *H03B 5/1212* (2013.01); *H03B 5/1215* (2013.01); *H03B 5/1228* (2013.01); *H03B 5/1296* (2013.01); *H03B 19/00* (2013.01); *H03L 7/24* (2013.01); *H03B 2200/0074* (2013.01)

(58) Field of Classification Search
CPC .. H03B 5/1228; H03B 5/1296; H03B 5/1215; H03B 5/1212; H03B 2200/0074; H03B 19/00; H03L 7/24
See application file for complete search history.

(56) References Cited

U.S. PATENT DOCUMENTS

| 9,306,496 B2* | 4/2016 | Kuo .................. H03B 5/1215 |
| 9,385,651 B2* | 7/2016 | Zong .................. H03L 7/0991 |
| 2019/0229675 A1* | 7/2019 | Bozorg .............. H03B 5/1212 |

OTHER PUBLICATIONS

Hegazi, Emad, Henrik Sjoland, and Asad A. Abidi. "A filtering technique to lower LC oscillator phase noise." IEEE Journal of Solid-State Circuits 36.12 (2001): 1921-1930. (Year: 2001).*
Babaie, Masoud et al., "A Class-F CMOS Oscillator", IEEE Journal of Solid-State Circuits, vol. 48, No. 12, Dec. 2013, 14 pgs.

(Continued)

*Primary Examiner* — Ryan Johnson
(74) *Attorney, Agent, or Firm* — Schwabe, Williamson & Wyatt, P.C.

(57) ABSTRACT

A frequency doubler (tripler, or quadrupler) employs current re-use coupled oscillator technique to enhance phase noise without increasing current consumption. Frequency doubler uses coupling between two oscillators running at different frequencies; a first oscillator is running at the target frequency and a second oscillator is running at half the frequency. The coupling between the two oscillators is via a transformer having a primary transformer coil and a secondary transformer coil. The first oscillator comprises a differential inductor, coarse/fine tuning capacitor arrays, and an n-type trans-conductor (GM). A virtual ground node of the n-type GM is coupled to one side of the primary transformer coil and the other side of the primary coil is coupled to the center tap of the secondary coil. The second oscillator comprises the secondary coil, coarse/fine tuning capacitor arrays, n-type GM, frequency tracking loop (FTL) and $2^{nd}$-harmonic LC filter network.

17 Claims, 7 Drawing Sheets

(56) References Cited

OTHER PUBLICATIONS

Hegazi, Emad et al., "A Filtering Technique to Lower LC Oscillator Phase Noise", IEEE Journal of Solid-State Circuits, vol. 36, No. 12, Dec. 2001, 10 pgs.
Kim, Jihwan et al., "A 112Gb/s PAM-4 Transmitter with 3-Tap FFE in 10nm CMOS", ISSCC 2018, Session 6, Ultra-High-Speed Wireline, 6.1, 3 pgs, 2018.
Leeson, D.B., "A Simple Model of Feedback Oscillator Noise Spectrum", Proceedings of the IEEE, vol. 54, pp. 329-330, Feb. 1966.
Murphy, David et al., "A 27-GHz Quad-Core CMOS Oscillator With No Mode Ambiguity", IEEE Journal of Solid-State Circuits, vol. 53, No. 11, Nov. 2018, 9 pgs.

\* cited by examiner

COUPLED FREQUENCY DOUBLER WITH FREQUENCY TRACKING LOOP

BACKGROUND

High frequency clock (e.g., 28 GHz) usage may desire low jitter specification. For example, for a 224 Gbps PAM-4 (pulse amplitude modulation) transmitter, a phase locked loop (PLL) is expected to deliver 28 GHz clock with random jitter less than 60 fs/sigma, and with jitter contribution from the oscillator of the PLL to be less than 42 fs (i.e., 60 fs/sqrt(2)), assuming the oscillator and reference clock contribute the same amount of random noise. To achieve such low noise, the oscillator phase noise is expected to be less than −103 dBc/Hz at 1 MHz offset. It is challenging for conventional oscillators and PLLs to meet such low phase noise target at 28 GHz frequency. The computing industry is expected to demand even higher transmitter speeds (e.g., faster than 224 Gbps PAM-4 transmitters).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
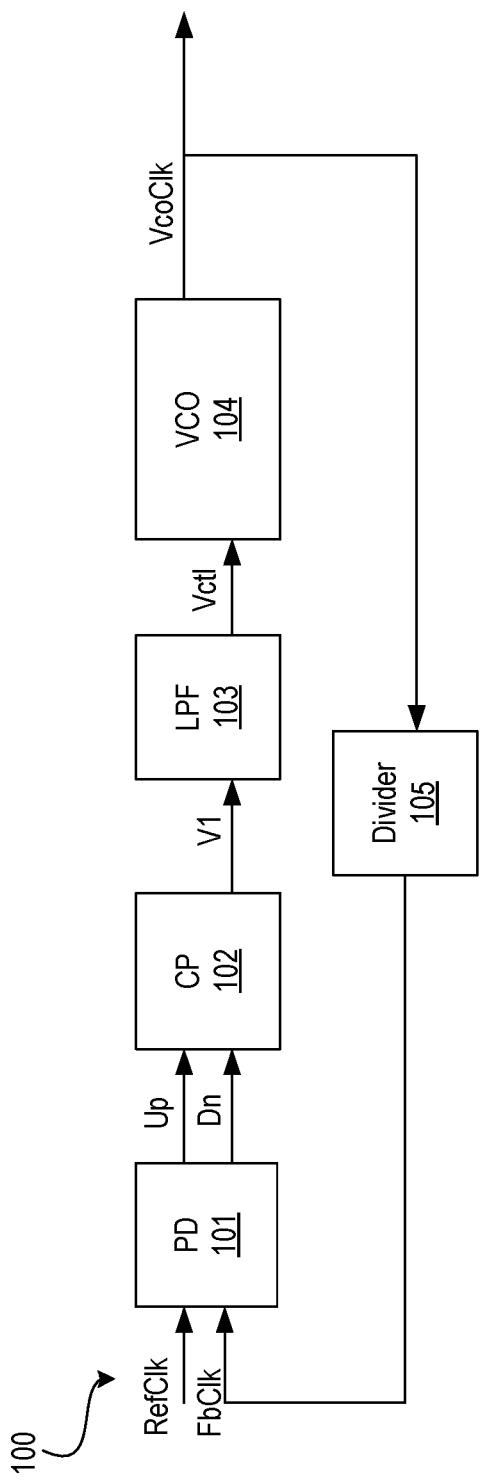
FIG. 1A illustrates an analog phase locked loop (PLL) with an oscillator comprising coupled frequency doubler, in accordance with some embodiments.

To design the low phase noise LC (inductor-capacitor) oscillator, a $2^{nd}$-harmonic filter can be added at complementary metal oxide semiconductor (CMOS) or N/PMOS trans-conductance (GM) cell virtual ground node. In another example, a class-F oscillator can be used to minimize signal phase noise by enhancing $3^{rd}$-harmonic. Also, an N-coupled oscillator is another candidate for low noise oscillator design as the phase noise can be reduced by 10 log(N). However, these solutions for low phase noise oscillator may not be applied to oscillator design above approximately 20 GHz since the main design bottleneck is the reduced capacitor quality factor (Q) as the operation frequency increases. Furthermore, the application of the class-F oscillator is limited to low frequency oscillator design since it requires a $3^{rd}$ harmonic LC filter design (e.g., 28×3 GHz for a 28 GHz oscillator). In the N-coupled oscillator, where multiple oscillators are tied together, its power consumption is not competitive with other architectures due to the fact that it consumes N-times more power consumption and area than the standard design.

Various embodiments describe a frequency doubler (tripler, or quadrupler) that employs current re-use coupled oscillator technique to enhance phase noise without increasing current consumption. In some embodiments, the frequency doubler (tripler, or quadrupler) comprises a first oscillator to generate a first output having a first frequency; a transformer coupled to the first oscillator; and a second oscillator coupled to the transformer, wherein the second oscillator is to generate a second output with a second frequency which is a harmonic of the first frequency, wherein the second frequency is higher than the first frequency. In some embodiments, the first oscillator includes a virtual ground node which is coupled to the transformer. In some embodiments, the first oscillator is an LC oscillator which comprises: a first LC tank; and trans-conductance transistors coupled to the first LC tank and the virtual ground node. In some embodiments, the first LC tank is controllable by a first fine control and first coarse control. In some embodiments, the first fine control and the first coarse control are generated by a digital loop filter.

In some embodiments, the second oscillator is a second LC oscillator which comprises trans-conductance transistors coupled to a second LC tank and an LC filter, wherein the second LC tank comprises a portion of the transformer. In some embodiments, the second LC tank is controllable by a second fine control and a second coarse control. In some embodiments, the second coarse control is a weighed version of the first coarse control. In some embodiments, the frequency doubler (tripler, or quadrupler) comprises a frequency tracking loop coupled to the trans-conductance transistors to determine a frequency mismatch between drain terminals of the trans-conductance transistors, and to generate the second fine control according to the frequency mismatch. In some embodiments, the second oscillator includes a virtual supply node which is coupled to the transformer. In some embodiments, the first output is coupled to an input of a divider. In some embodiments, the second output is coupled to an IO transmitter.

Frequency doubler uses coupling between two oscillators running at different frequencies where the first oscillator is running at the target frequency and the second oscillator is running at half the frequency. The coupling between the two oscillators is via the transformer having a primary transformer coil and a secondary transformer coil. The first oscillator comprises a differential inductor, coarse/fine tuning capacitor arrays, and an n-type trans-conductor (GM). A virtual ground node of the n-type GM is coupled to one side of the primary transformer coil and the other side of the primary coil is coupled to the center tap of the secondary coil. The second oscillator comprises the secondary coil, coarse/fine tuning capacitor arrays, n-type GM, frequency tracking loop (FTL) and $2^{nd}$-harmonic LC filter network.

There are many technical effects of various embodiments. For example, the coupling with the lower frequency oscillator can achieve up to, for example 4.5 dB, better phase noise performance because of increased capacitor quality factor. A phase locked loop architecture using such an oscillator scheme can achieve such low jitter performance and thus enabling SerDes (serial/de-serializer) with data rate of 224 Gbps and higher. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" here generally refers to any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1A illustrates an analog phase locked loop (PLL) with an oscillator comprising coupled frequency doubler, in accordance with some embodiments. PLL 100 comprises phase detector 101, charge pump (CP) 102, low pass filter (LPF) 103, voltage controlled oscillator (VCO) 104, and divider 105. The phase detector 101 receives a reference clock (RefClk) and a feedback clock (FbClk) and generates Up and/or Down (Dn) signals that are pulses that represent the relative phase different between the RefClk and the FbClk. Some implementations of phase detector 101 use analog techniques, while others use digital circuitry. The phase detector 101 can be designed to be sensitive to just phase or sensitive to frequency and to phase. When phase detectors are sensitive to phase of RefClk and FbClk, they produce an output that is proportional to the phase difference between the two signals. When the phase difference between the RefClk and FbClk is steady, phase detector 101 produces a constant voltage. When there is a frequency difference between the two signals, phase detector 101 produces a varying voltage. Example implementations of phase detectors 101 include diode ring phase detector, exclusive OR phased phase detector, JK flip-flop based comparators, and dual D-type phase detectors. Generally, when a digital phase detector are is to implement phase detector 101, short Up and Dn pulses are created by the logic gates of the digital phase detector. The static phase error is the pulse width difference between Up and Dn pulses, which is caused by leakage current and the charge pump current mismatch.

Charge pump 102 receives the Up and Dn pulses and sources or sinks current on node V1. The signal on V1 is then filtered by LPF 103 to generate a filtered control voltage Vctl. Vctl is then used to control the oscillating frequency of VCO 104. The output of VCO 104 is VcoClk which is then divided in frequency by Divider 105 to generate FbClk. During PLL lock, Up and Dn signals provide evidence of dynamic phase error. Dynamic phase error is the phase error between RefClk and FbClk before PLL is declared locked. A PLL is declared locked when the phase difference between RefClk and FbClk is below a predetermined threshold. The dynamic phase error is reduced by the feedback loop of the PLL.

In various embodiment, VCO 104 comprises a frequency doubler (tripler, or quadrupler) that employs current re-use coupled oscillator technique to enhance phase noise without increasing current consumption. Frequency doubler uses coupling between two oscillators running at different frequencies. In some embodiments, the two oscillator of VCO 104 include a first oscillator that oscillates at the target frequency and a second oscillator that oscillators at half the frequency. The coupling between the two oscillators is via a transformer having a primary transformer coil and a secondary transformer coil. The two oscillators can be ring oscillators or LC oscillators. Various embodiments here are described with reference to LC oscillators for the first and second oscillators. However, the embodiments are applicable to ring oscillators too.

The first oscillator comprises a differential inductor, coarse/fine tuning capacitor arrays, and an n-type transconductor (GM). A virtual ground node of the n-type GM is coupled to one side of the primary transformer coil and the other side of the primary coil is coupled to the center tap of the secondary coil. The second oscillator comprises the secondary coil, coarse/fine tuning capacitor arrays, n-type GM, frequency tracking loop (FTL) and $2^{nd}$-harmonic LC filter network. The output of the first oscillator is VcoClk which used by divider 105 to generate feedback clock FbClk. The output of the second oscillator is the high frequency clock with double, triple, or quadruple frequency of the VcoClk frequency. In some embodiments, the output of the second oscillator is to input to divider 105 which then divides that output to generate FbClk.

Figure 1B:
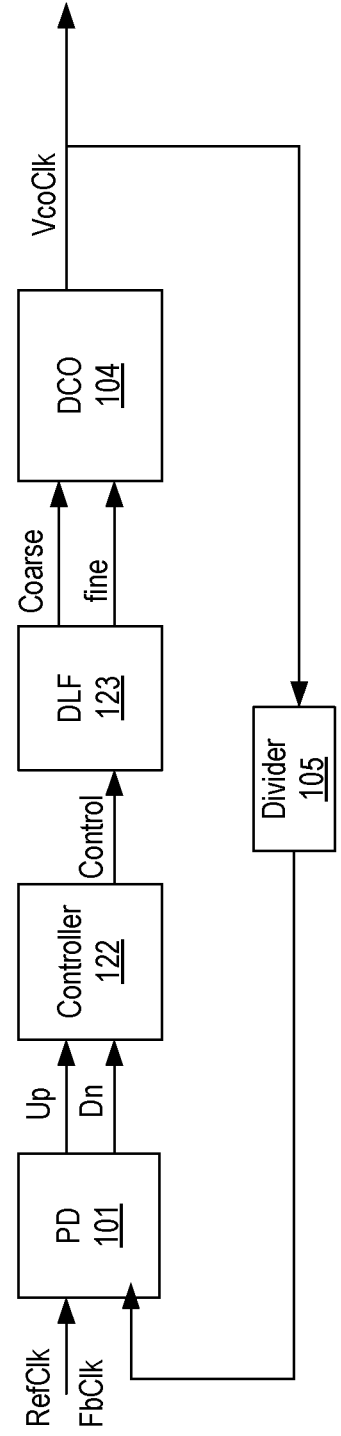
FIG. 1B illustrates a digital PLL with an oscillator comprising coupled frequency doubler, in accordance with some embodiments.

FIG. 1B illustrates a digital PLL 120 with an oscillator comprising coupled frequency doubler, in accordance with some embodiments. Compared to PLL 100, here CP 102 and LPF 103 are replaced with a controller 122 (e.g., finite state machine) and a digital loop filter (DLF) 123. In some embodiments, phase detector 101 is replaced with a time-to-digital converter (TDC). A TDC converts the phase error between RefClk and FbClk to a digital code (e.g., 4-bit code spe<3:0>), along with a single bit signal, lead, which indicates the relative phase of RefClk and FbClk. Controller 122 receives the single bit and causes the DLF 123 to increase or decrease the codes for coarse/fine bit codes.

While the embodiments of the frequency doubler (tripler, or quadrupler) are illustrated with reference to a PLL, the frequency doubler (tripler, or quadrupler) can be standalone oscillators or part of other circuits.

Figure 2:
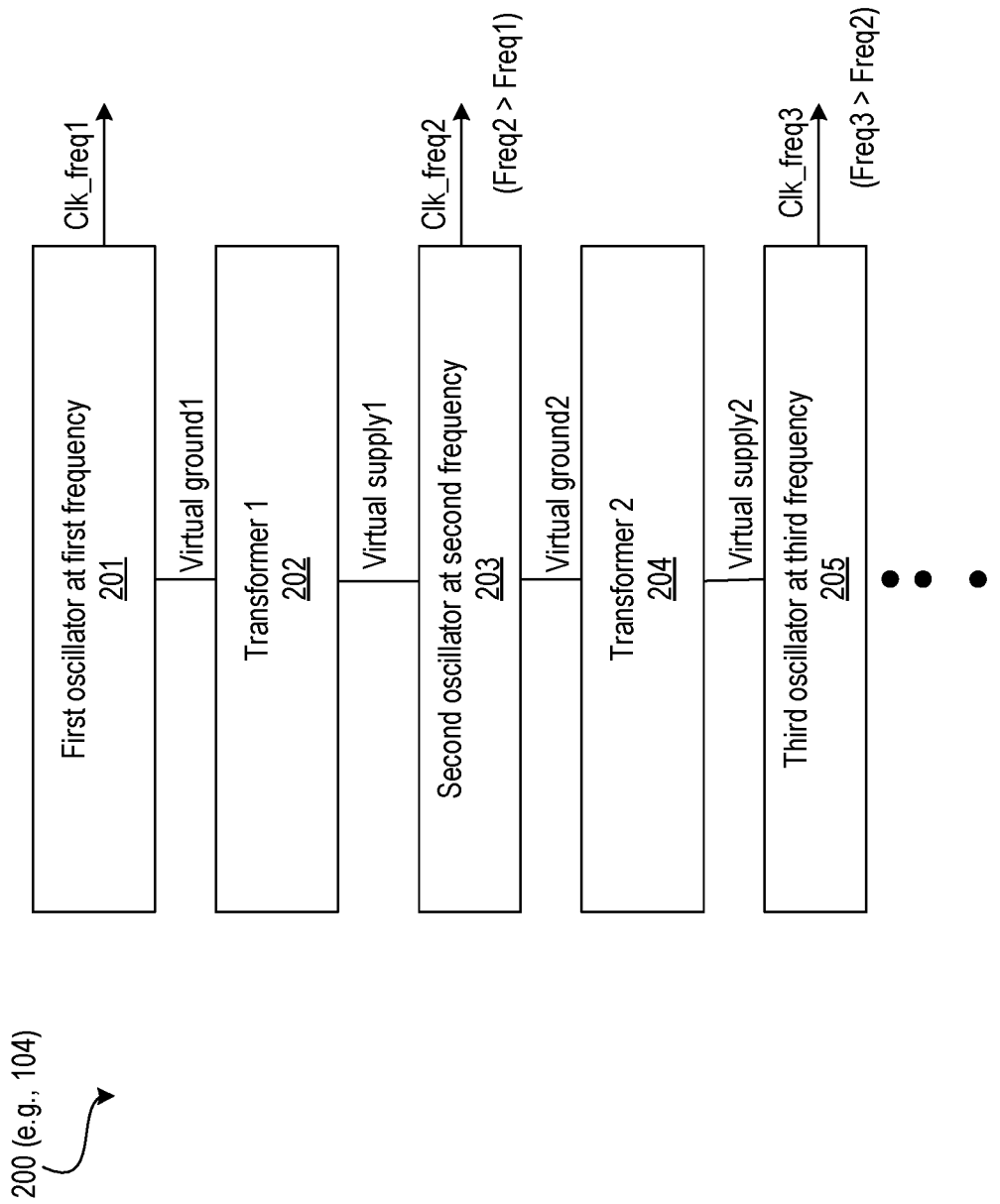
FIG. 2 illustrates a high-level architecture of an oscillator comprising coupled frequency doubler, in accordance with some embodiments.

FIG. 2 illustrates a high-level architecture 200 (e.g., VCO/DCO 104) of an oscillator comprising coupled frequency doubler, in accordance with some embodiments. While various embodiments are described with reference to two oscillators, more than two oscillators may be coupled with respective transformers to generate multiple high frequency clocks. In this example, first oscillator 201 with first oscillating frequency (Clk_freq1) has a virtual ground 1 which is coupled to transformer 202 (Transformer 1). Virtual supply 1 of second oscillator 203 having second oscillating frequency (Clk_freq2) is coupled to transformer 1 202.

The virtual ground node of an n-type GM of the first oscillator 201 is coupled to one side of the primary transformer coil of transformer 202 and the other side of the primary coil is coupled to the center tap of the secondary coil of transformer 202. Transformer 202 couples harmonics of first oscillator 201 to second oscillator 203. As such, Clk_freq2 is double, triple, or quadruple of Clk_freq1.

The concept of coupling oscillators via transformers can continue to N number of oscillators and transformers, where N is an integer. For example, virtual ground (Virtual ground2) of second oscillator 203 is coupled to the primary transformer coil of transformer 204 and the other side of the primary coil is coupled to the center tap of the secondary coil of transformer 204. The virtual supply (Virtual supply2) of third oscillator 205 is coupled to transformer 204 (Transformer 2). Transformer 204 couples harmonics of second oscillator 203 to third oscillator 205. As such, Clk_freq3 is double, triple, or quadruple of Clk_freq2.

Figure 3:
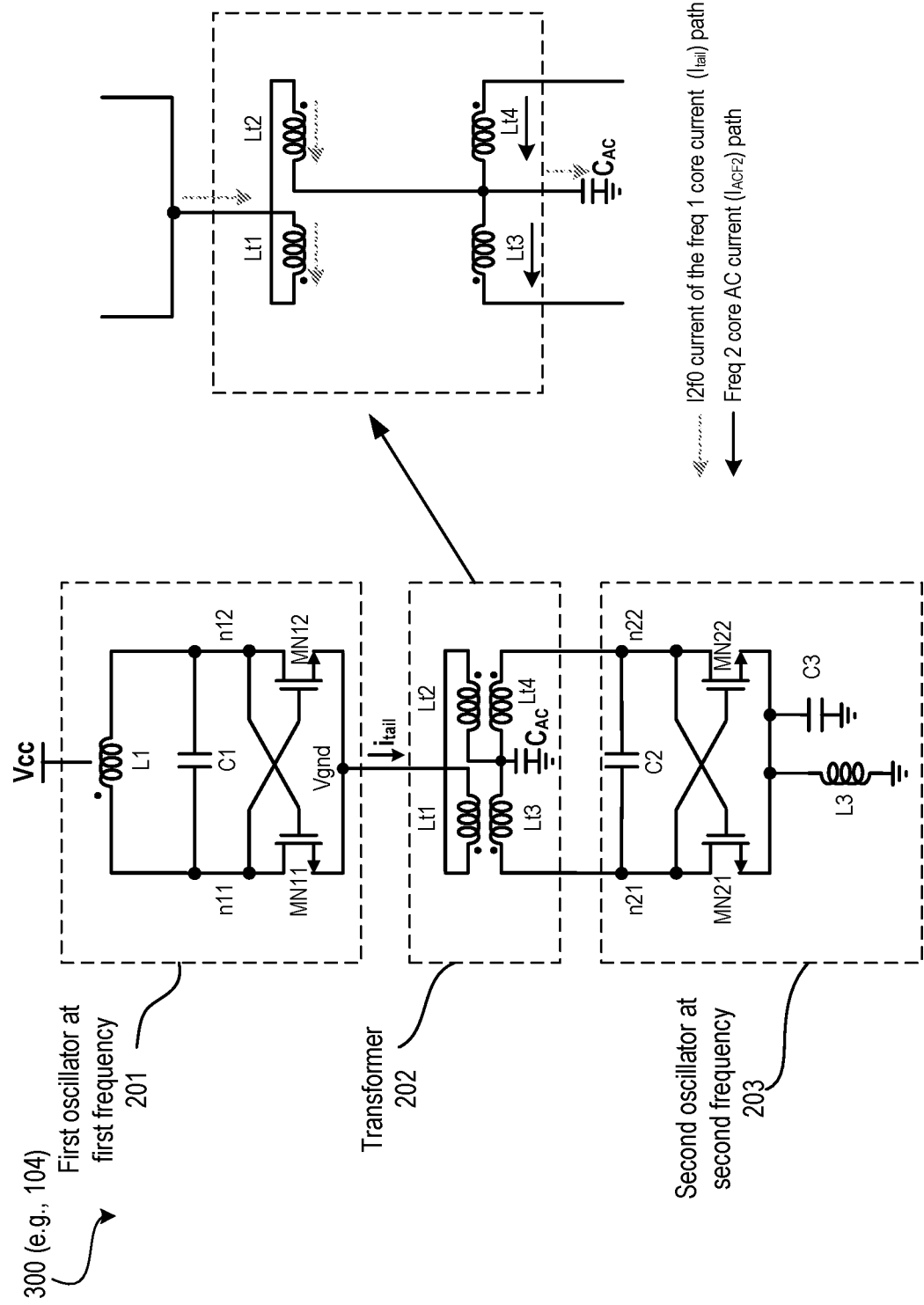
FIG. 3 illustrates a coupled frequency doubler architecture and transformer coupling mechanism, in accordance with some embodiments.

FIG. 3 illustrates a coupled frequency doubler architecture 300 and transformer coupling mechanism, in accordance with some embodiments. The current re-use coupled oscillator architecture comprises two NMOS-coupled LC oscillators. First oscillator 201 comprises n-type transistors MN1 and MN12 and LC tank comprising L1 and C1. The gate terminal of transistor MN11 is coupled to node n12, and the gate terminal of transistor MN11 is coupled to node n11. The virtual ground (Vgnd) of first oscillator 201 is coupled transformer 202. Transformer 202 comprises primary coils Lt1 and Lt2, and secondary coils Lt3 and Lt4. Coils Lt2, Lt3, and Lt4 is coupled to an AC coupling capacitor $C_{AC}$. Second oscillator 203 comprises n-type transistors MN21 and MN22, capacitor C2, and filter including inductor L3 and C3. The gate terminal of transistor MN21 is coupled to node n22, and the gate terminal of transistor MN22 is coupled to node n21. The LC tank of second oscillator 203 is formed of capacitor C2 and inductors of transformer 202.

In one example, for 224 Gbps SerDes, the first (top) oscillator 201 is running at 14 GHz and the second (bottom) oscillator 203 is running at 28 GHz. The two oscillators are coupled through transformer 202. The $2^{nd}$-harmonic (2f0) AC current ($I_{tail}$) of the first oscillator (e.g., 14 GHz oscillator) flows into the primary coil (L1) and the differential AC current ($I_{AC28G}$) of the second oscillator 203 (e.g., 28 GHz oscillator) flows into the secondary coil (Lt3 and Lt4). When the capacitor bank of the oscillators is tuned, the two currents are coupled through transformer 202 and the signal power can be enhanced by some harmonic (e.g., twice, thrice, four times, etc.).

Compared with conventional coupled oscillators, architecture 300 has several advantages. For example, architecture 300 has better phase noise performance by coupling second oscillator 203 (e.g., 28 GHz oscillator) with first oscillator (e.g., 14 GHz oscillator). As shown in equation 1:

$$L(f_m) \propto 10\log\left[\frac{1}{2}\left(\frac{f_0}{2Q_T f_m}\right)^2\right] \quad (1)$$

the single-sided band (SSB) phase noise is inversely proportional to the tank quality factor, where $f_0$ is the oscillator output frequency, $Q_T$ is loaded tank quality factor, and $f_m$ is offset from the output frequency.

With half the operation frequency, the capacitor bank quality factor is doubled, and hence the oscillator phase noise can be improved (i.e., reduced). For example, when inductor and capacitor bank quality factor are 14 and 10 at 28 GHz, respectively, by simply lowering the operation frequency by half, the tank quality factor can be improved by 37% assuming the inductor quality factor is not significantly degraded due to a skin effect. Therefore, the phase noise at 14 GHz is lowered by approximately 4 dB except for phase noise reduction due to frequency scale. As a result, by coupling with the approximately 4 dB better phase noise performance oscillator (assuming 1:1 coupling and using the equation:

$$\text{phase noise of coupled oscillators} = 10\log\frac{10^{\frac{PN1}{10}} + \beta^2 10^{\frac{PN2}{10}}}{(1+\beta)^2}$$

where PN1 and PN2 are oscillator phase noises, respectively, and β is a coupling coefficient), the coupled oscillator (e.g., second oscillator 203) can have approximately 4.5 dB better phase noise performance than the conventional stand-alone oscillator at 28 GHz.

In various embodiments, with architecture 300, the clock divider for the clock generated by second oscillator 203 can be eliminated. As such, higher clock frequency (Clk_freq2) can be achieved using a PLL without having a divider to divide that clock (i.e., clock of Clk_freq2) to generate the feedback FbClk. Designing a divider that can divide high clock frequencies such as 28 GHz is challenging because of such high speeds and reliability requirements. With architecture 300, the PLL feedback loop can be constructed with the output of first oscillator (e.g., 14 GHz core output) while the output of second oscillator (e.g., 28 GHz core output) drives an IO transmitter (e.g., a 224 Gbps SerDes PAM-4 IO transmitter).

Another benefit of architecture 300 is its lower power consumption compared to other architectures used to generate high clock frequencies. By stacking the oscillators on each other and re-using DC bias current, the current consumption can be reduced by, for example, 50% compared with the conventional coupled oscillator design. Oscillator architecture 300 has a smaller output swing due to reduced voltage headroom, however, by increasing supply voltage slightly, the output swing can be recovered without too much power penalty while meeting reliability constraints. Table I shows a summary of the relative performance comparison with conventional LC oscillators (OSCs) and coupled oscillators.

TABLE 1

|  | CMOS GM OSC | NMOS GM OSC | Coupled NMOS OSCs | Coupled Frequency Doubler |
|---|---|---|---|---|
| Supply Voltage | 1x | 0.5x | 0.5x | 1x |
| Current | 1x | 2x | 4x | 2x |
| Relative Phase Noise (dB) | 0 | 0 | −3 | −4.5 |
| Relative FOM (dB) | 0 | 0 | 0 | −1.5 |

Here, FOM refers to Figure Of Merit defined as:

FOM=phase noise at $f_{offset}$+10*log 10(Power/1 mW)−20*log 10($f0/f_{offset}$)

Figure 4:
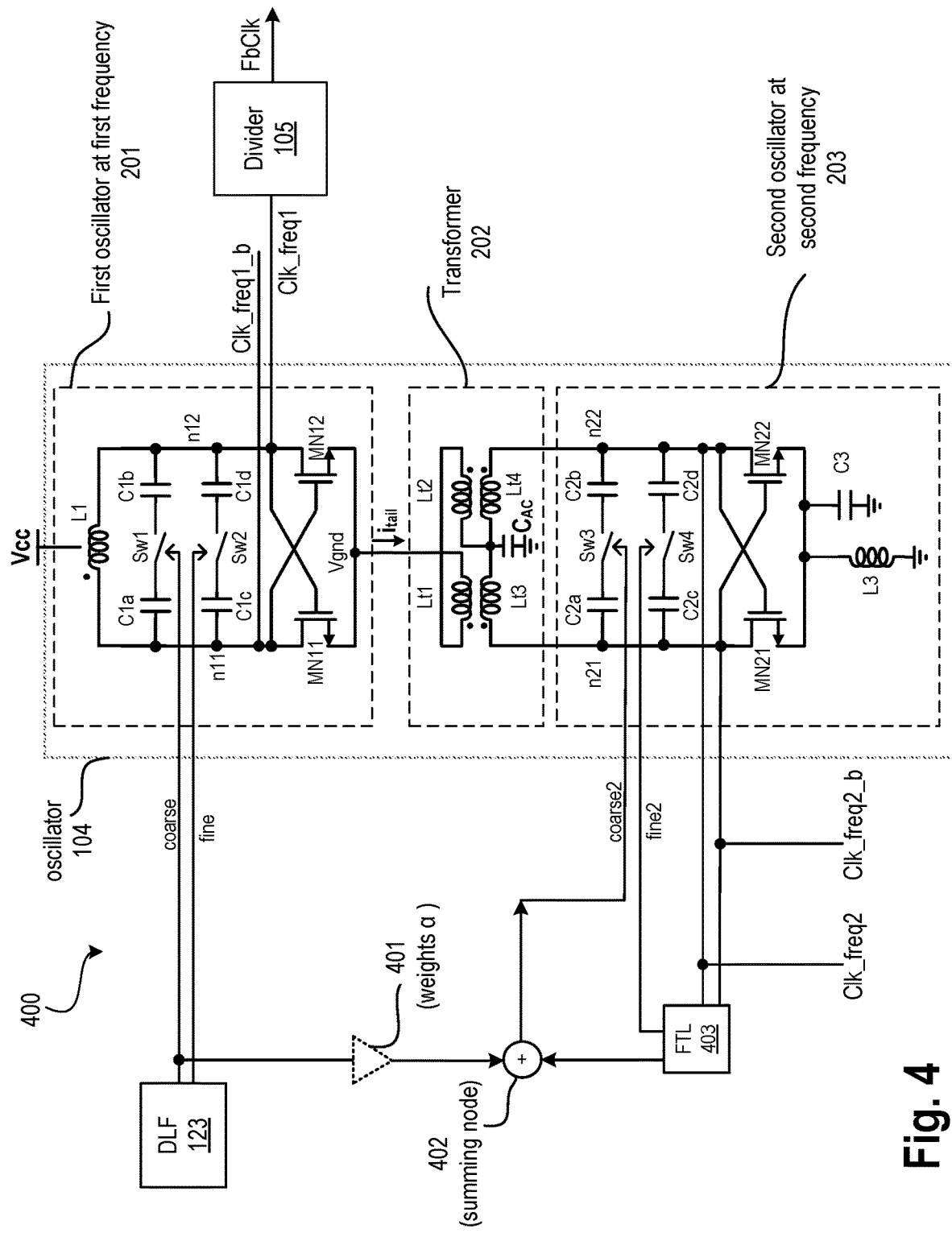
FIG. 4 illustrates a circuit-level architecture coupled frequency doubler, in accordance with some embodiments.

FIG. 4 illustrates a circuit-level architecture 400 coupled frequency doubler, in accordance with some embodiments. DLF 123 provides fine and coarse controls (e.g., bit codes) to control capacitor banks of first oscillator 201. The capacitor C1 of first oscillator 201 comprises capacitor arrays C1a and C1b that are part of a coarse bank. The capacitors between nodes n11 and n12 can be added to or subtracted out using switch(es) Sw1 controllable by the coarse code. The capacitor C1 of first oscillator 201 also comprises capacitor arrays C1c and C1d that are part of a fine bank. These capacitors between nodes n11 and n12 can be added to or subtracted out using switch(es) Sw2 controllable by the fine code.

Coarse controls (e.g., bit codes) from DLF 123 are also used to control capacitor banks of second oscillator 203. The capacitor C2 of second oscillator 203 comprises capacitor arrays C2a and C2b that are part of a coarse bank. The capacitors between nodes n21 and n22 can be added to or subtracted out using switch(es) Sw3 controllable by the coarse code (corase2). The capacitor C2 of second oscillator 203 also comprises capacitor arrays C2c and C2d that are part of a fine bank. These capacitors between nodes n21 and n22 can be added to or subtracted out using switch(es) Sw4 controllable by a fine code (fine2). The switches can be implemented as n-type devices, p-type devices, or a combination of n-type and p-type devices.

Both first oscillator 201 (e.g., 14 GHz oscillator) and second oscillator 203 (e.g., 28 GHz oscillator) share the same coarse tuning control signals from the digital loop filter 123. In some embodiments, the coarse control (coarse2) for second oscillator 203 has weighting factor(s) (a) 401 which is based on inductance and capacitance ratio of the first oscillator 201 and second oscillator 203. The coarse frequency control loop tunes the two oscillators' frequency at first oscillator frequency (Clk_freq1) and second oscillator frequency (Clk_freq2). In some embodiments, any residual frequency error in the coarse control (coarse2) is corrected by frequency tracking loop (FTL) 403.

In some embodiments, FTL 403 measures the frequency mismatch between first oscillator 201 and second oscillator 203 frequencies and tunes the second oscillator coarse and fine-tuning capacitors to reduce the frequency error. The second oscillator coarse tuning is adjusted at summing node 402 where coarse tuning code from DLF 123 for first oscillator 201 are modified. In some embodiments, the first oscillator coarse tuning code is adjusted prior to modification at summing node 402. For example, weights for first oscillator coarse tuning code are adjusted prior to adjusting any residual frequency error in the coarse control for second oscillator 203.

The virtual ground node Vgnd of the n-type GM transistors MN11 and MN12 is connected to one side of the primary transformer coil and the other side of the primary coil is connected to the center tap of the secondary coil. Second oscillator 203 is formed by the secondary coil, coarse/fine tuning capacitor arrays (C2a, C3b, C2c, and C2d), NMOS GM from transistors MN21 and MN22, FTL 403 and $2^{nd}$-harmonic LC filter network (L3 and C3).

One of the output clocks Clk_freq1 or its complementary clock Clk_freq1_b is used by divider 105 to generate the feedback clock FbClk. The output clocks Clk_freq2 or its complementary clock Clk_freq2_b of second oscillator 203 (e.g., 28 GHz core output) drives an IO transmitter, for example.

Figure 5:
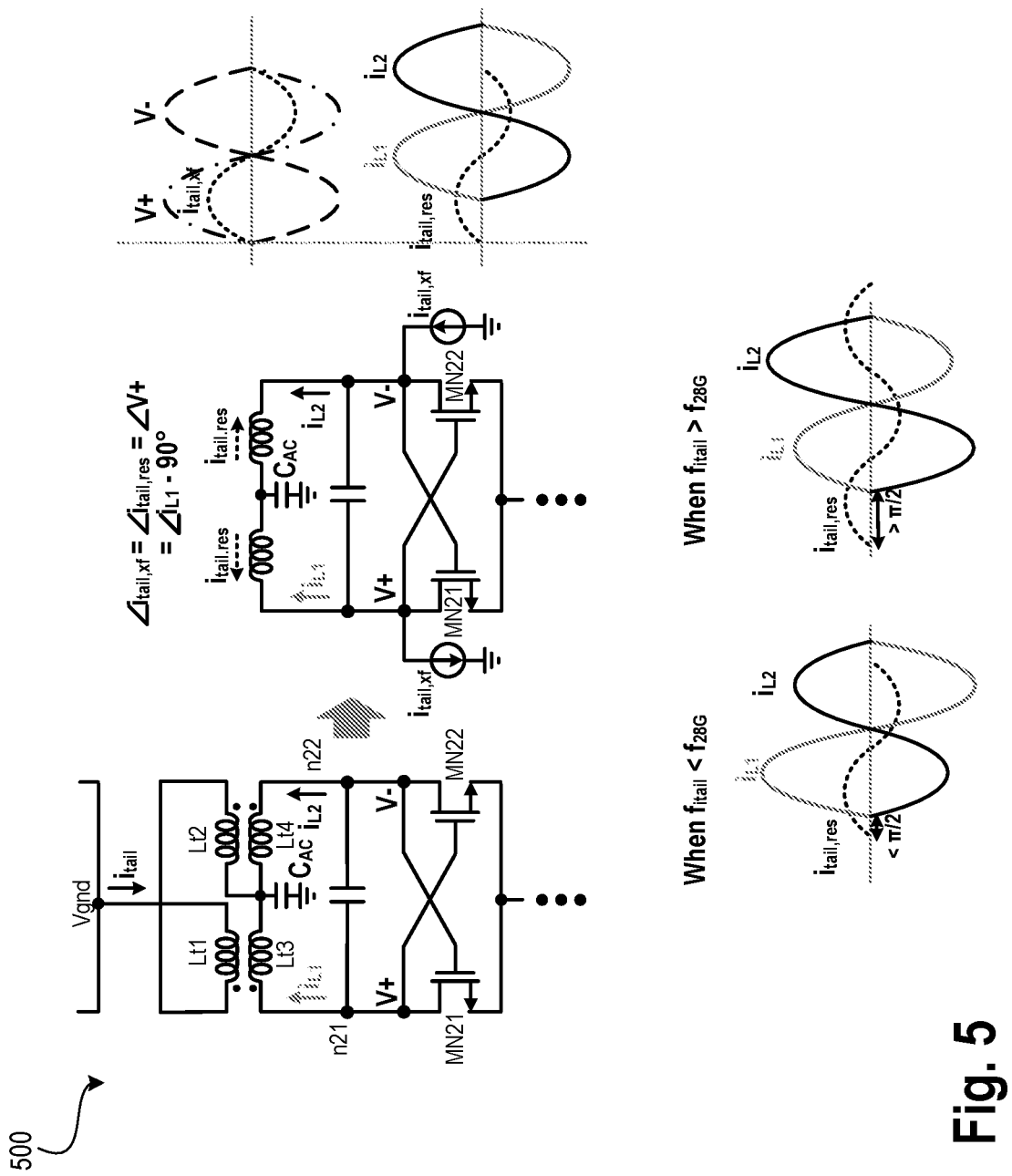
FIG. 5 illustrates equivalent coupled oscillator model and voltage and current relationship when the two core frequency is machined and unmatched, in accordance with some embodiments.

FIG. 5 illustrates equivalent coupled oscillator model 500 and voltage and current relationship when the two core frequency is machined and unmatched, in accordance with some embodiments. The frequency mismatch between the two oscillators 201 and 203 can be detected by monitoring the oscillator +/− node (n21 and n22) amplitude difference of oscillator 203. FIG. 5 shows how the frequency mismatch leads the voltage difference. The frequency doubler can be re-drawn with the injection current source. The tail current ($i_{tail}$) from first oscillator 201 is coupled to the secondary coil current and the induced current ($i_{tail,xf}$) at the secondary coil is modeled as the injection current source at the drain nodes of the trans-conductor. When the injection current $i_{tail,xf}$ and the core frequencies of second oscillator 203 are identical, the injection current $i_{tail,xf}$ and the oscillator output voltage V+ are in-phase and thus $i_{tail,xf}$ is 90-degree shifted (or substantially 90 degree shifted) compared with the current flowing through the inductor ($i_{L1,2}$). In addition to the injection current, the tail current $i_{tail}$ of the first oscillator 201 core frequency flows into the AC coupling capacitor ($C_{AC}$) and any residual current ($i_{tail,res}$) flows into both inductors ($L_1$, $L_2$).

When the tail current frequency and second oscillator 203 core intrinsic frequency are matched, $i_{tail,xf}/i_{tail,res}$ and $i_{L1}$ have 90-degree phase difference (or substantially 90-degree phase difference) and $i_{tail,res}$ does not result in any amplitude mismatch between $i_{L1}$ and $i_{L2}$. However, when the tail current frequency deviates from the second oscillator 203 core frequency, the frequency mismatch results in phase mismatch between $i_{tail,xf}/i_{tail,res}$ and V+ due to phase shift of LC tank impedance. Therefore, the phase difference between $i_{tail,res}$ and $i_{L1}$ is no longer 90 degree (or substantially 90 degree), thereby resulting in the current amplitude mismatch between $i_{L1}$ and $i_{L2}$.

The current mismatch generates the oscillator output node amplitude difference and it can be exploited for the frequency error detection. By using an amplitude detector (e.g., peak detector), the frequency mismatch can be extracted and it can be used for the fine frequency control.

Figure 6:
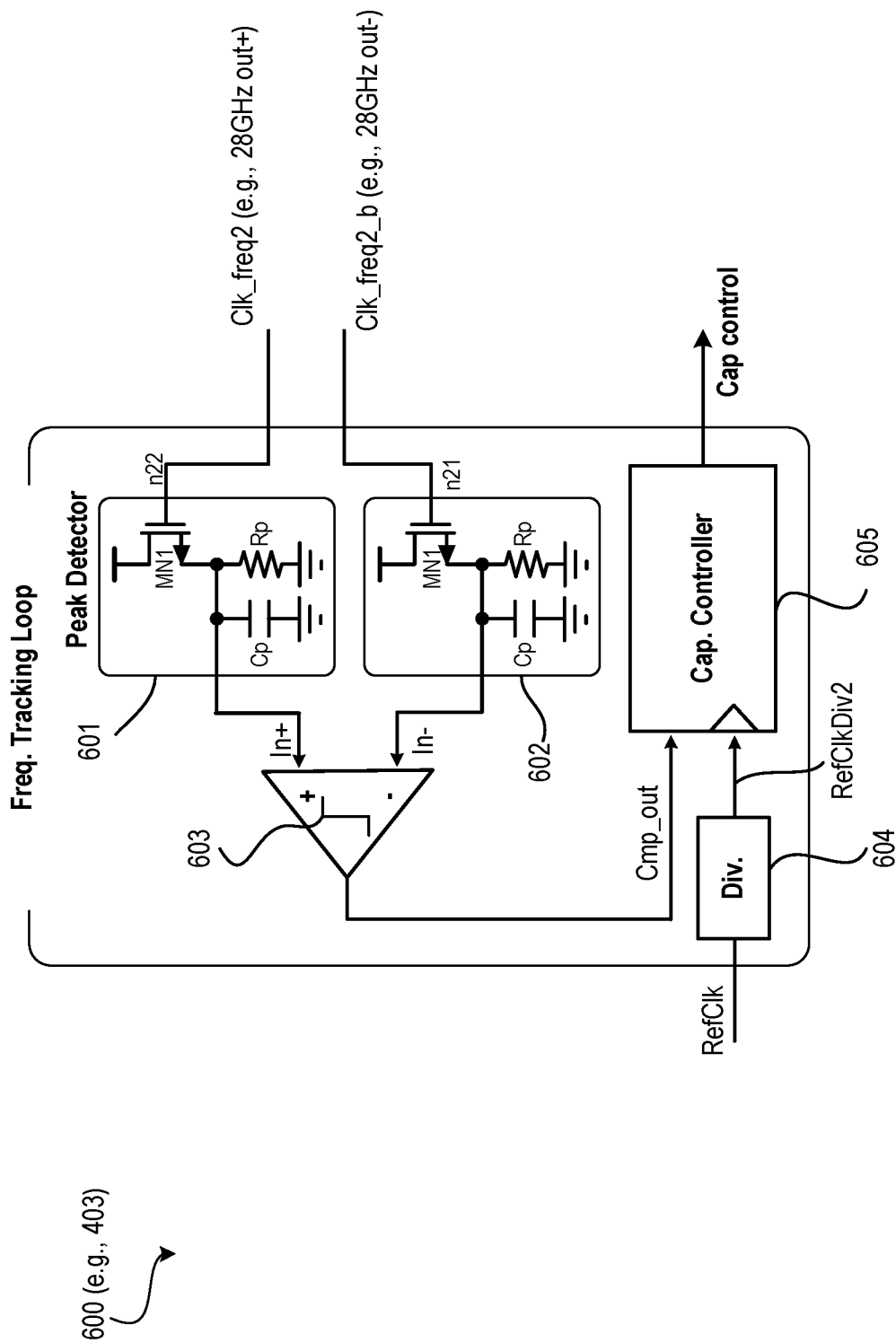
FIG. 6 illustrates a frequency tracking loop circuit, in accordance with some embodiments.

FIG. 6 illustrates a frequency tracking loop (FTL) circuit 600, in accordance with some embodiments. FTL 600 comprises peak detectors 601 and 602, comparator 603, divider 604, and capacitance (Cap.) controller 605. The peak detectors comprise n-type transistor MN1, resistor Rp and capacitor Cp coupled as shown. Node n22 is coupled to the gate of transistor MN1 of first peak detector 601. Node n21 is coupled to the gate of transistor MN1 of second peak detector 602. The output nodes In+ and In– of peak detectors 601 and 602, respectively, output amplitude DC values of Clk_freq2 (28 GHz)+/– outputs and then comparator 603 outputs up/down signal (Cmp_out) to control capacitor bank of second oscillator 203. In some embodiments, capacitor controller 605 comprises an up/down counter. The counter operates on a slow clock which can be derived by dividing down the reference clock (RefClk) by divider 604. The frequency tracking loop can be used as one-time or continuous calibration according to application demand.

Figure 7:
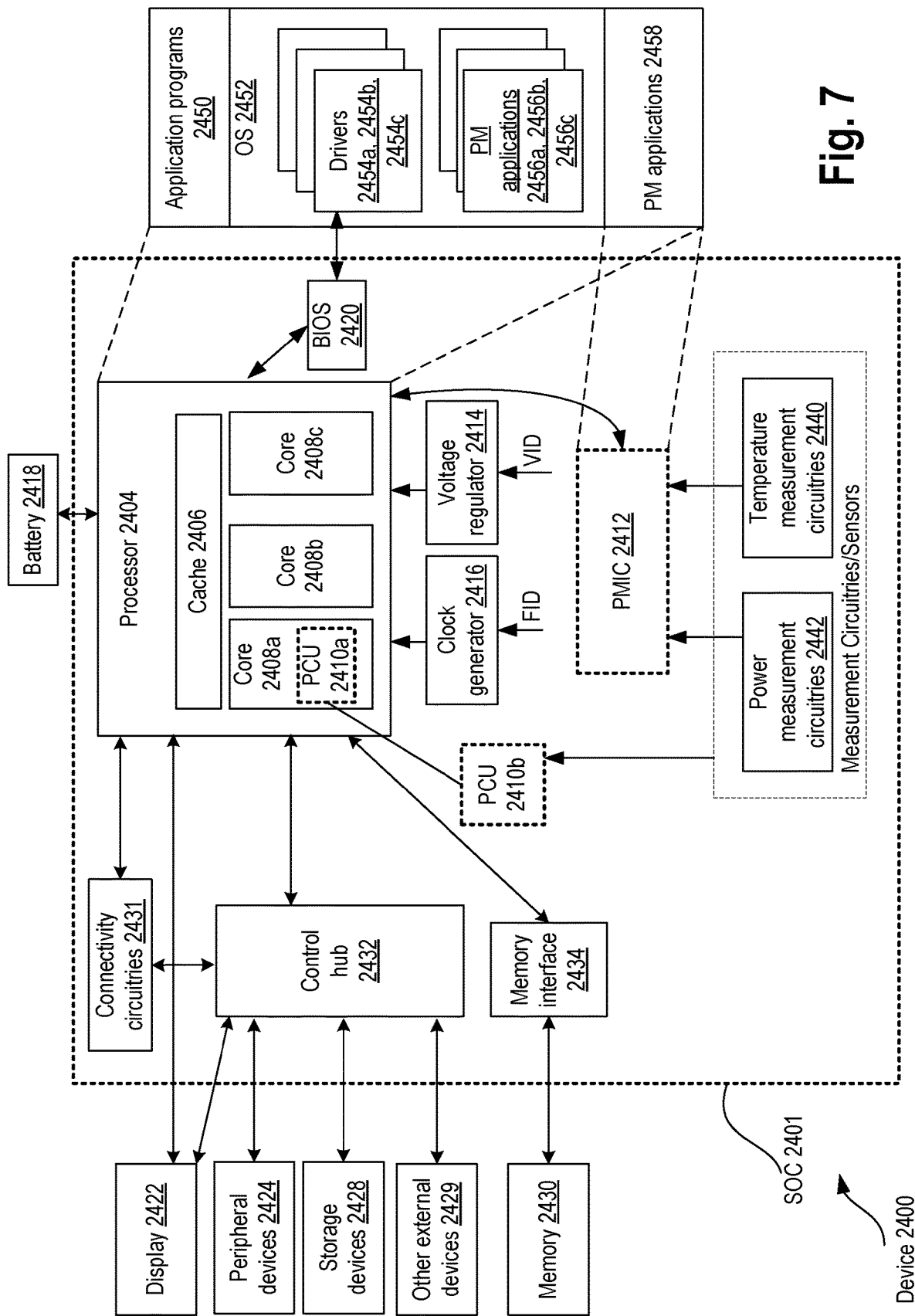
FIG. 7 illustrates a smart device or a computer system or a SoC (System-on-Chip) having a coupled frequency doubler, in accordance with various embodiments.

FIG. 7 illustrates a smart device or a computer system or a SoC (System-on-Chip) having a coupled frequency doubler, in accordance with various embodiments. It is pointed out that those elements of FIG. 7 having the same reference numbers (or names) as the elements of any other figure can operate or function in any manner similar to that described, but are not limited to such. Any of the blocks described here can have the coupled frequency doubler. For example, a clocking source (e.g., PLL) for high-speed I/Os may have the coupled frequency doubler as their oscillator.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 7, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 7, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/ or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408a, 2408b, 2408c, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410a. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System (OS) 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments described herein are illustrated as examples. The features of these examples can be combined with one another in any suitable way. These examples include:

Example 1: An apparatus comprising: a first oscillator to generate a first output having a first frequency; a transformer coupled to the first oscillator; and a second oscillator coupled to the transformer, wherein the second oscillator is to generate a second output with a second frequency which is a harmonic of the first frequency, wherein the second frequency is higher than the first frequency.

Example 2: The apparatus of example 1, wherein the first oscillator includes a virtual ground node which is coupled to the transformer.

Example 3: The apparatus of example 2, wherein the first oscillator is an LC oscillator which comprises: a first LC tank; and trans-conductance transistors coupled to the first LC tank and the virtual ground node.

Example 4: The apparatus of example 3, wherein the first LC tank is controllable by a first fine control and first coarse control.

Example 5: The apparatus of example 4, wherein the first fine control and the first coarse control are generated by a digital loop filter.

Example 6: The apparatus of example 5, wherein the second oscillator is a second LC oscillator which comprises trans-conductance transistors coupled to a second LC tank and an LC filter, wherein the second LC tank comprises a portion of the transformer.

Example 7: The apparatus of example 6, wherein the second LC tank is controllable by a second fine control and a second coarse control.

Example 8: The apparatus of example 7, wherein the second coarse control is a weighed version of the first coarse control.

Example 9: The apparatus of example 7 comprises a frequency tracking loop coupled to the trans-conductance transistors to determine a frequency mismatch between drain terminals of the trans-conductance transistors, and to generate the second fine control according to the frequency mismatch.

Example 10: The apparatus of example 1, wherein the second oscillator includes a virtual supply node which is coupled to the transformer.

Example 11: The apparatus of example 1, wherein the first output is coupled to an input of a divider.

Example 12: The apparatus of example 1, wherein the second output is coupled to an JO transmitter.

Example 13: An apparatus comprising: a phase detector to receive a reference clock and a feedback clock, and to generate up and/or down signals according to a phase difference between the reference clock and the feedback clock; a charge pump to receive the up and/or down signals, and to generate bias according to the up and/or down signals; a filter to filter the bias; and an oscillator to receive the bias, wherein the oscillator comprises: a first oscillator to generate a first output having a first frequency; a transformer coupled to the first oscillator; and a second oscillator coupled to the transformer, wherein the second oscillator is to generate a second output with a second frequency which is a harmonic of the first frequency, wherein the second frequency is higher than the first frequency.

Example 14: The apparatus of example 13 comprises a divider to receive the first output and to generate the feedback clock.

Example 15: The apparatus of example 13, wherein the second output is coupled to an JO transmitter.

Example 16: The apparatus of example 13, wherein the first oscillator includes a virtual ground node which is coupled to the transformer.

Example 17: The apparatus of example 13, wherein the second oscillator includes a virtual supply node which is coupled to the transformer.

Example 18: A system comprising: a memory; a processor coupled to the memory; and a wireless interface communicatively coupled to the processor, wherein the processor includes an oscillator which comprises: a first oscillator to generate a first output having a first frequency; a transformer coupled to the first oscillator; and a second oscillator coupled to the transformer, wherein the second oscillator is to generate a second output with a second frequency which is a harmonic of the first frequency, wherein the second frequency is higher than the first frequency.

Example 19: The system of example 18, wherein the processor comprises a divider to receive the first output and to generate a feedback clock for a phase locked loop.

Example 20: The system of example 18, wherein the processor includes an JO transmitter, wherein the second output is coupled to the JO transmitter.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first oscillator to generate a first output having a first frequency, wherein the first oscillator includes a first LC tank that is controllable by a first fine control and a first coarse control;
   a transformer coupled to the first oscillator; and
   a second oscillator coupled to the transformer, wherein the second oscillator is to generate a second output with a second frequency which is a harmonic of the first frequency, wherein the second frequency is higher than the first frequency, wherein the second oscillator includes trans-conductance transistors coupled to a second LC tank and an LC filter, wherein the second LC tank is controllable by a second fine control and a second coarse control.

2. The apparatus of claim 1, wherein the first oscillator includes a virtual ground node which is coupled to the transformer.

3. The apparatus of claim 2, wherein the first oscillator further includes
trans-conductance transistors coupled to the first LC tank and the virtual ground node.

4. The apparatus of claim 1, wherein the first fine control and the first coarse control are generated by a digital loop filter.

5. The apparatus of claim 4, wherein the second LC tank comprises a portion of the transformer.

6. The apparatus of claim 1, wherein the second coarse control is a weighed version of the first coarse control.

7. The apparatus of claim 1, further comprising a frequency tracking loop coupled to the trans-conductance transistors to determine a frequency mismatch between drain terminals of the trans-conductance transistors, and to generate the second fine control according to the frequency mismatch.

8. The apparatus of claim 1, wherein the second oscillator includes a virtual supply node which is coupled to the transformer.

9. The apparatus of claim 1, wherein the first output is coupled to an input of a divider.

10. The apparatus of claim 1, wherein the second output is coupled to a transmitter.

11. An apparatus comprising:
a phase detector to receive a reference clock and a feedback clock, and to generate up and/or down signals according to a phase difference between the reference clock and the feedback clock;
a charge pump to receive the up and/or down signals, and to generate bias according to the up and/or down signals;
a filter to filter the bias; and
an oscillator to receive the bias, wherein the oscillator comprises:
a first oscillator to generate a first output having a first frequency;
a transformer coupled to the first oscillator; and
a second oscillator coupled to the transformer, wherein the second oscillator is to generate a second output with a second frequency which is a harmonic of the first frequency, wherein the second frequency is higher than the first frequency;
wherein the first oscillator includes a virtual ground node that is coupled to the transformer, and wherein the transformer is to receive a current from the virtual ground node.

12. The apparatus of claim 11 comprises a divider to receive the first output and to generate the feedback clock.

13. The apparatus of claim 11, wherein the second output is coupled to a transmitter.

14. The apparatus of claim 11, wherein the second oscillator includes a virtual supply node which is coupled to the transformer.

15. A system comprising:
a memory;
a processor coupled to the memory; and
a wireless interface communicatively coupled to the processor, wherein the processor includes an oscillator which comprises:
a first oscillator to generate a first output having a first frequency;
a transformer coupled to the first oscillator; and
a second oscillator coupled to the transformer, wherein the second oscillator is to generate a second output with a second frequency which is a harmonic of the first frequency, wherein the second frequency is higher than the first frequency;
wherein the first oscillator includes a virtual ground node that is coupled to the transformer, and wherein the transformer is to receive a current from the virtual ground node.

16. The system of claim 15, wherein the processor comprises a divider to receive the first output and to generate a feedback clock for a phase locked loop.

17. The system of claim 15, wherein the processor includes a transmitter, wherein the second output is coupled to the transmitter.

* * * * *